(12) United States Patent
Koike et al.

(10) Patent No.: US 11,404,597 B2
(45) Date of Patent: Aug. 2, 2022

(54) SOLAR CELL AND METHOD OF MANUFACTURING THE SAME

(71) Applicant: Material Concept, Inc., Sendai (JP)

(72) Inventors: Junichi Koike, Sendai (JP); Masaaki Saiga, Sendai (JP); Yuji Sutou, Sendai (JP)

(73) Assignee: MATERIAL CONCEPT, INC., Sendai (JP)

( * ) Notice: Subject to any disclaimer, the term of this patent is extended or adjusted under 35 U.S.C. 154(b) by 0 days.

(21) Appl. No.: 15/691,078

(22) Filed: Aug. 30, 2017

(65) Prior Publication Data

US 2018/0198017 A1 Jul. 12, 2018

(30) Foreign Application Priority Data

Aug. 31, 2016 (JP) .............................. JP2016-170118

(51) Int. Cl.
*H01L 31/20* (2006.01)
*H01L 31/0224* (2006.01)
(Continued)

(52) U.S. Cl.
CPC ...... *H01L 31/202* (2013.01); *H01L 31/02168* (2013.01); *H01L 31/022425* (2013.01); *H01L 31/03762* (2013.01); *H01L 31/068* (2013.01); *H01L 31/072* (2013.01); *H01L 31/1804* (2013.01); *H01L 21/02686* (2013.01);
(Continued)

(58) Field of Classification Search
CPC ............. H01L 31/202; H01L 31/03762; H01L 31/072; H01L 31/1804; H01L 31/068; H01L 31/022425; H01L 31/02168; H01L 21/02686; H01L 31/1868; H01L 33/44; H01L 39/2448; H01L 39/249; H01L 51/0009; H01L 2224/03552; H01L 2924/40102; Y02E 10/547; Y02E 10/548; Y02P 70/50
See application file for complete search history.

(56) References Cited

U.S. PATENT DOCUMENTS

2002/0078992 A1\* 6/2002 Woditsch ................ C30B 11/00
136/261
2009/0188554 A1\* 7/2009 Aiken ............. H01L 31/022433
136/256
(Continued)

FOREIGN PATENT DOCUMENTS

CN 102623564 A 8/2012
CN 103296093 A 9/2013
(Continued)

OTHER PUBLICATIONS

Annerose Knorz et al., "Selective Laser Ablation of SiNx Layers on Textured Surfaces for Low Temperature Front Side Metallizations," Progress in Photovoltaics: Research and Applications; Oct. 15, 2008, vol. 17, No. 2, pp. 127-136.
(Continued)

*Primary Examiner* — Michael Y Sun
(74) *Attorney, Agent, or Firm* — Cantor Colburn LLP

(57) ABSTRACT

Provided are a solar cell having a good conversion efficiency in which damage to a p-n junction structure is prevented when an antireflection film is removed, and a method of manufacturing such a solar cell.

8 Claims, 4 Drawing Sheets

(51) Int. Cl.
  *H01L 31/0216* (2014.01)
  *H01L 31/068* (2012.01)
  *H01L 31/18* (2006.01)
  *H01L 31/0376* (2006.01)
  *H01L 31/072* (2012.01)
  *H01L 39/24* (2006.01)
  *H01L 51/00* (2006.01)
  *H01L 21/02* (2006.01)
  *H01L 33/44* (2010.01)

(52) U.S. Cl.
  CPC .......... *H01L 31/1868* (2013.01); *H01L 33/44* (2013.01); *H01L 39/249* (2013.01); *H01L 39/2448* (2013.01); *H01L 51/0009* (2013.01); *H01L 2224/03552* (2013.01); *H01L 2924/40102* (2013.01); *Y02E 10/547* (2013.01); *Y02P 70/50* (2015.11)

(56) References Cited

U.S. PATENT DOCUMENTS

| | | | |
|---|---|---|---|
| 2010/0147376 A1* | 6/2010 | Iwazaki | H01L 31/0236 136/256 |
| 2010/0213166 A1 | 8/2010 | Kray et al. | |
| 2011/0162703 A1* | 7/2011 | Adibi | H01L 31/022425 136/256 |
| 2012/0060917 A1 | 3/2012 | Jin et al. | |
| 2013/0020568 A1* | 1/2013 | Yamazaki | H01L 51/4213 257/43 |
| 2013/0220411 A1* | 8/2013 | Lee | H01L 31/022425 136/256 |
| 2013/0255747 A1* | 10/2013 | Hashigami | H01L 31/022425 136/244 |
| 2013/0340822 A1 | 12/2013 | Nam et al. | |
| 2014/0076401 A1* | 3/2014 | King | H01L 31/0687 136/261 |
| 2015/0024541 A1 | 1/2015 | Jaffrennou et al. | |
| 2015/0136219 A1 | 5/2015 | Koike et al. | |
| 2015/0228816 A1* | 8/2015 | Matsuyama | H01L 31/0747 136/256 |
| 2016/0126375 A1* | 5/2016 | Morikawa | H01L 31/022425 136/244 |
| 2016/0284889 A1 | 9/2016 | Akimoto et al. | |
| 2016/0300967 A1* | 10/2016 | Kobayashi | H01L 31/0747 |
| 2016/0329444 A1 | 11/2016 | Koike et al. | |
| 2017/0170342 A1* | 6/2017 | Harada | H01L 31/035281 |

FOREIGN PATENT DOCUMENTS

| | | |
|---|---|---|
| CN | 103762279 A | 4/2014 |
| DE | 102011102270 A1 | 11/2012 |
| EP | 2631953 A2 | 8/2013 |
| EP | 2639834 A2 | 9/2013 |
| EP | 2677551 A1 | 12/2013 |
| JP | 2002270869 A | 9/2002 |
| JP | 2005050925 A | 2/2005 |
| JP | 2009524523 A | 7/2009 |
| JP | 2013526053 A | 6/2013 |
| JP | 2013143433 A | 7/2013 |
| JP | 2013175706 A | 9/2013 |
| JP | 2014007382 A | 1/2014 |
| JP | 5598739 B2 | 10/2014 |
| JP | 2014209598 A | 11/2014 |
| JP | 2015515747 A | 5/2015 |
| JP | 5735093 B1 | 6/2015 |
| WO | 2012030019 A1 | 3/2012 |

OTHER PUBLICATIONS

Extended European Search Report corresponding to Application No. 17188484.4-1504; dated Jan. 4, 2018.
Wei-Chi Chou et al., "Influence of Reducing Inactive Phosphorus on the Emitter Region," 28th European Photovoltaic Solar Energy Conference and Exhibition; Sep. 30 to Oct. 4, 2013; pp. 2069-2071.
SIPO Office Action corresponding to Application No. CN201710757738.6; dated Jan. 2, 2019.
JPO Notification of Reasons for Refusal for corresponding JP Application No. 2016-170118, dated Jul. 21, 2020.
JPO Notification of Reasons for Refusal corresponding to JP Application No. 2016-170118; dated Dec. 15, 2020.
G. Poulain et al., "Characterization of laser-induced damage in silicon solar cells during selective ablation processes", Materials Science and Engineering B, 2013, vol. 178, pp. 682-685.

* cited by examiner

FIG. 1A
FIG. 1B
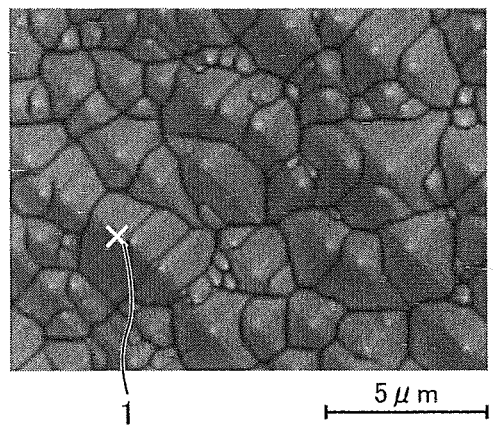
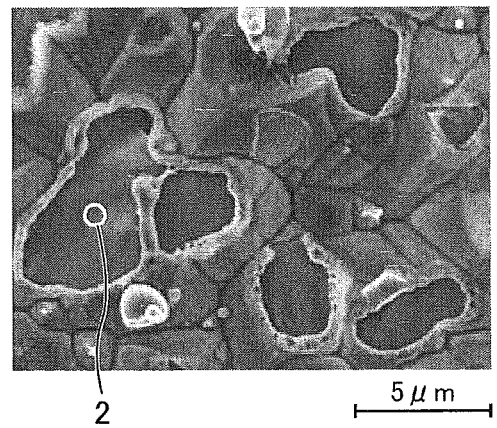
FIG. 2
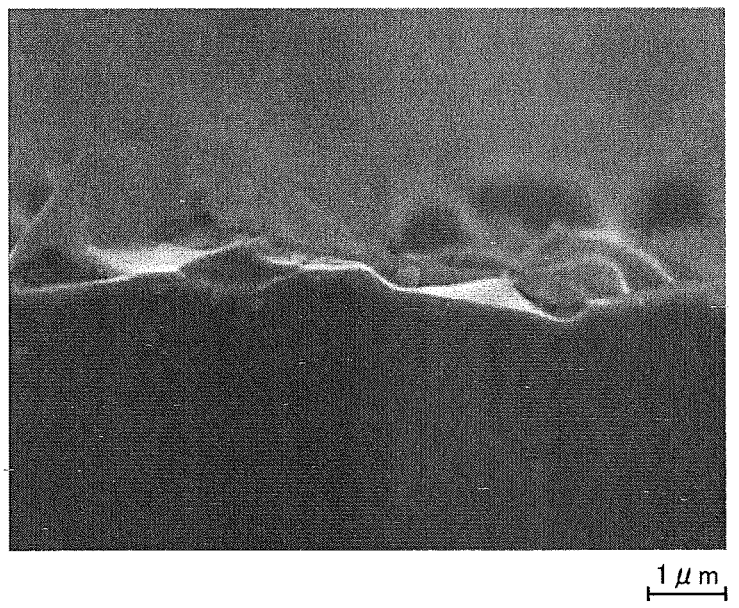

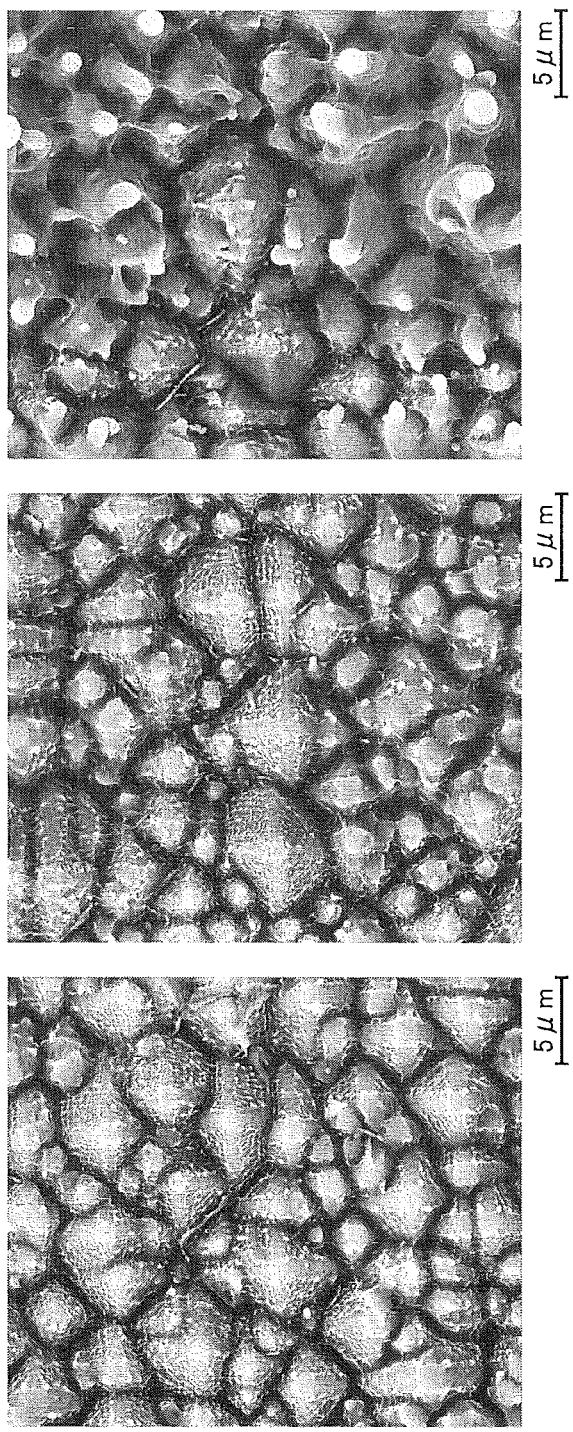

SOLAR CELL AND METHOD OF MANUFACTURING THE SAME

CROSS-REFERENCE TO RELATED APPLICATIONS

The present application claims priority under 35 U.S.C. § 119 to Japanese Patent Application No. 2016-170118, filed on Aug. 31, 2016, the entire content of which is incorporated herein by reference.

BACKGROUND OF THE INVENTION

Field of the Invention

The present invention relates to a solar cell having an antireflection film, and a method of manufacturing the above solar cell.

Related Art

A solar battery cell having a semiconductor such as silicon (Si) as a substrate may include an antireflection film formed at a surface of the substrate in order to allow incident light to be efficiently taken into the inside of the substrate. In general, silicon nitride (SiN) with a thickness of about 100 nm is used as an antireflection film.

Metal wiring for taking out electric power generated by incident light inside the substrate to the outside is also formed at a surface of a solar battery cell. The metal wiring includes a narrow finger electrode and a wide bus electrode, and needs to be electrically conducted to the semiconductor substrate.

An antireflection film, which is usually made of an insulating material, needs to be removed from a place where metal wiring will be formed in order to assure electrical conduction between the metal wiring and the semiconductor substrate. As a means of removing an antireflection film as described above, methods of removal by irradiation with a laser beam have been reported.

For example, Patent Document 1 describes a method including removing an antireflection film with a laser beam, and further removing a damaged layer at a semiconductor substrate formed through the antireflection film by a chemical treatment.

Further, Patent Document 2 describes a method including a dry etching step of etching an antireflection film with a laser beam, and a wet etching step of removing a damage layer formed at an emitter portion of a silicon substrate during the dry etching step.

Patent Document 1: Japanese Unexamined Patent Application, Publication No. 2005-050925
Patent Document 2: Japanese Unexamined Patent Application, Publication No. 2013-526053

SUMMARY OF THE INVENTION

However, the methods that have been reported to date have a disadvantage in that the p-n junction structure of a substrate may irreversibly be damaged when removing an antireflection film, resulting in the deterioration of conversion efficiency of a solar cell. Therefore, an improved efficiency of electric power generation is difficult to achieve even when a portion of the antireflection film is removed, and metal wiring is formed at that portion.

The present invention is made in view of the above circumstances. Objects of the present invention are to provide a solar cell having a good conversion efficiency in which damage to a p-n junction structure is prevented when an antireflection film is removed, and to provide a method of manufacturing such a solar cell.

The present inventors studied structural characteristics of a portion for forming wiring where an antireflection film has been removed, and further extensively studied conditions of a laser beam and conditions for removing an antireflection film with a laser beam required to achieve these structural characteristics. Then, the present invention has been completed. Specifically, the present invention provides the followings.

(1) The present invention provides a solar cell including a metal electrode, an antireflection film, and a semiconductor substrate, in which a portion where the antireflection film is present and a portion where the antireflection film is absent are intermingled between the bottom of the metal electrode formed on the side of a light-receiving surface and the substrate, and the mean area percentage of the portion where the antireflection film is absent is 10% or more and 80% or less relative to the area of the bottom of the metal electrode.

(2) The present invention provides the solar cell according to (1), in which the surface of the portion where the antireflection film is absent has a center line average roughness (Ra) of 1.5 µm or less.

(3) The present invention provides the solar cell according to (1) or (2), in which the semiconductor substrate located underneath the metal electrode has a crystalline structure.

(4) The present invention provides a method of manufacturing a solar cell including a metal electrode, an antireflection film, and a semiconductor substrate, the method including: a step of forming the antireflection film on the semiconductor substrate; a removal step of partially removing the antireflection film by irradiating with a laser beam a region of the antireflection film corresponding to a location where the metal electrode is to be formed; and a step of forming the metal electrode, in which the removal step includes irradiation with a laser beam having a wavelength of 380 nm or more and 500 nm or less.

(5) The present invention provides the method of manufacturing a solar cell according to (4), in which the laser beam has an output power of 5 W or more and 80 W or less.

(6) The present invention provides the method of manufacturing a solar cell according to (4) or (5), in which the laser beam includes a pulsed laser beam with a pulse width of 1 picosecond or more and 50 microseconds or less.

(7) The present invention provides the method of manufacturing a solar cell according to any one of (4) to (6), in which the laser beam includes a pulsed laser beam with an output power density of 0.03 mJ/cm$^2$ or more and 20 J/cm$^2$ or less.

(8) The present invention provides the method of manufacturing a solar cell according to any one of (4) to (7), in which the laser beam includes a pulsed laser beam and a continuous-wave laser beam.

(9) The present invention provides the method of manufacturing a solar cell according to any one of (4) to (8), in which the removal step includes heating the semiconductor substrate at 100° C. or more and 570° C. or less.

According to the present invention, damage to the p-n junction structure of a substrate can be prevented when performing removal treatment of an antireflection film. Therefore, a solar cell having good conversion efficiency can be obtained, and a method of manufacturing a solar cell having good conversion efficiency can be achieved.

BRIEF DESCRIPTION OF THE DRAWINGS

FIG. 1A and FIG. 1B show SEM (scanning electron microscope) images of surfaces of a sample from Example. FIG. 1A represents an image of a surface of the sample before laser beam irradiation, and FIG. 1B represents a surface of the sample after laser beam irradiation.

FIG. 2 shows an SEM image of a cross section of a region which was processed by FIB after the antireflection film was removed.

FIG. 6A to FIG. 6C show SEM images of the surfaces of samples irradiated with a pulsed laser beam with varied output power densities. FIG. 6A, FIG. 6B, and FIG. 6C represent images after irradiation at an output power density of 0.55 J/cm$^2$, 0.61 J/cm$^2$, and 0.76 J/cm$^2$, respectively.

DETAILED DESCRIPTION OF THE INVENTION

Figure 3:
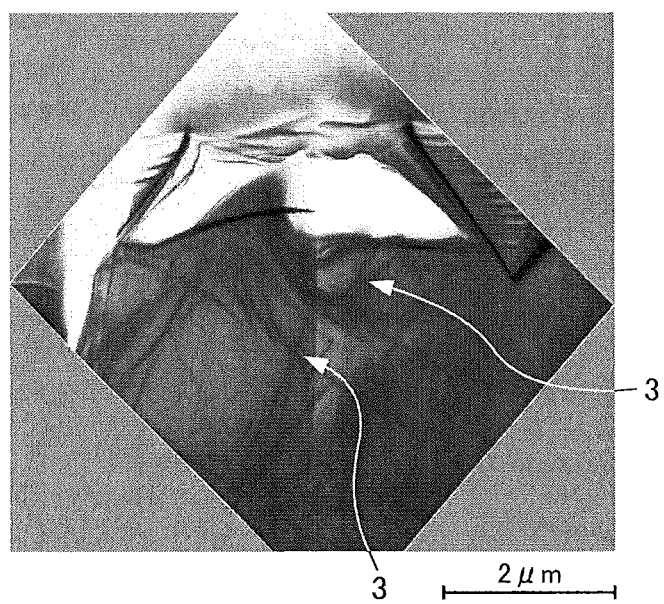
FIG. 3 shows a transmission electron microscope image of a cross section of a region where the antireflection film was removed.

Below, specific embodiments of the present invention will be described in detail. The present invention shall not be limited to the following embodiments in any way, and modifications may suitably be made without departing from the scope of the present invention.
(Solar Cell)

A solar cell according to the present embodiment includes a metal electrode, an antireflection film, and a semiconductor substrate, in which a portion where the antireflection film is present and a portion where the antireflection film is absent are intermingled between the bottom of the metal electrode formed at the side of a light-receiving surface and the substrate, and the mean area percentage of the portion where the antireflection film is absent is 10% or more and 80% or less of the area of the bottom of the metal electrode.

A value obtained by dividing maximum output power ($P_{max}$) by the product of open-circuit voltage ($V_{oc}$) and short-circuit current ($I_{sc}$) is called a fill factor (FF), and represented by the formula, $FF=P_{max}/(V_{oc} \times I_{sc})$. A larger amount of electric power can be taken out from a solar cell having a larger value of FF. In the solar cell according to the present embodiment, the antireflection film is formed at the side of the light-receiving surface of the semiconductor substrate, and the metal electrode is formed at a location where the antireflection film has been partially removed from a place for forming the metal electrode. When the area percentage of a portion where the antireflection film is absent is less than 10% of the area of the bottom of the metal electrode, the contact resistivity between the metal electrode and the semiconductor substrate increases, resulting in an excessively increased series resistance. Therefore, a sufficient FF cannot be obtained. On the other hand, when the area percentage is more than 80%, the damage to the semiconductor substrate becomes excessively larger as the area of a portion where the antireflection film is removed increases. This will decrease $V_{oc}$. Therefore, when the area percentage of a portion where the antireflection film is absent is 10% or more and 80% or less of the area of the bottom of the metal electrode, a good state of contact between the metal electrode and the silicon substrate can be obtained without significantly impairing solar cell properties. The lower limit of the area percentage is preferably 20% or more, more preferably 30% or more. The upper limit of the area percentage is preferably 70% or less, more preferably 60% or less.

The antireflection film located at places corresponding to the bottoms of a bus electrode and a finger electrode, which serve as the metal electrode, can be selectively removed. When the antireflection film located at a place corresponding to the bottom of the finger electrode is removed, an effect for preventing increased $V_0$ can be obtained more significantly as compared with a case where the antireflection film corresponding to the bus electrode is removed. Therefore, only the antireflection film underneath the finger electrode may be removed.

The antireflection film is provided for preventing carrier recombination at the surface of a semiconductor substrate and for reducing reflection of incident light to increase the amount of incident light introduced into the semiconductor substrate. In the solar cell according to the present embodiment, a material such as silicon nitride (SiN), silicon oxide ($SiO_2$), zinc oxide (ZnO), and aluminum oxide ($Al_2O_3$) may be used as an antireflection film.

A monocrystalline silicon substrate or a polycrystalline silicon substrate can be used as a semiconductor substrate. A p-type silicon substrate in which an acceptor-type impurity such as boron (B) is doped in a silicon substrate, and n-type silicon substrate in which a donor-type impurity such as phosphorus (P) is doped may be used. A substrate made of a different semiconductor material other than silicon may be used.

Preferably, the solar cell according to the present embodiment has a center line average roughness (Ra) of 1.5 μm or less at the surface of a region where the antireflection film is absent. The term "center line" as used herein refers to a straight line drawn so that the area of protruded portions above the center line is equal to the area of depressed portions within an error of about 10% at the surface portion of a cross section.

In a solar cell, a pyramidal texture architecture with a height of 3 to 5 μm is usually formed by etching the surface of a substrate with an alkali solution in order to reduce reflection of incident light. A metal electrode to be formed in a region where an antireflection film is absent will be formed along the surface of the above texture architecture. Therefore, when a relatively large texture architecture having the above surface roughness is present, the adhesiveness between the metal electrode and the substrate may be poor, resulting in increased interfacial contact resistance. In contrast, when the surface of a region where the antireflection film is absent is evenly formed such that the center line average roughness (Ra) is 1.5 μm or less, the metal electrode is continuously bonded on the silicon substrate with a good adhesiveness, leading to reduced interfacial contact resistance. This in turn can improve FF.

In the solar cell according to the present embodiment, the semiconductor substrate located underneath the metal electrode preferably has a crystalline structure.

When a portion of the antireflection film located underneath the metal electrode is removed by a method such as laser beam radiation, a surface portion of the underlying semiconductor substrate may be modified to have an amorphous structure depending on the processing conditions at that time. When an amorphous structure is present at the surface of a substrate, the life time and mobility of carrier generated by sunlight are impaired, and many characteristic factors of the solar cell are deteriorated. Therefore, the crystalline structure of the semiconductor substrate located underneath the metal electrode is preferably maintained because deterioration of the characteristic factors of the solar cell can be prevented.

(Method of Manufacturing Solar Cell)

The method of manufacturing a solar cell including a metal electrode, an antireflection film, and a semiconductor substrate according to the present embodiment includes: a step of forming the antireflection film on the semiconductor substrate; a removal step of partially removing the antireflection film by irradiating with a laser beam a region of the antireflection film corresponding to a location where the metal electrode is to be formed; and a step of forming the metal electrode.

The aforementioned step of partially removing the antireflection film preferably includes irradiating a predetermined region with a laser beam having a wavelength of 380 nm or more and 500 nm or less.

The energy (unit: eV) of a photon may be obtained by the formula of "1240/wavelength (nm)." For example, the energy of a photon having a wavelength of 380 nm or more and 500 nm or less is equivalent to 2.48 eV or more and 3.1 eV or less. Meanwhile, the bandgap energy of a material at the room temperature is at a level of 1.1 eV for silicon (Si), 5.2 eV for SiN which can be used for an antireflection film, 8.9 eV for $SiO_2$, 3.4 eV for ZnO, and the like. This means that the laser beam used in the method of manufacturing a solar cell according to the present invention will not be absorbed by the antireflection film (SiN), but will only be absorbed by silicon.

Further, the absorption coefficient of silicon at the wavelength region of 380 nm or more and 500 nm or less is in the range of between $1\times10^4$/cm and $1\times10^5$/cm. Therefore, the laser beam can be efficiently absorbed by silicon, and can heat silicon to decompose and remove the antireflection film. When the wavelength is less than 380 nm, the energy of a photon may be too large, resulting in an excessive damage to silicon. When the wavelength is more than 500 nm, the energy of a photon may be too small to sufficiently heat silicon. Therefore, decomposition and removal of the antireflection film may be difficult. Taken together, the lower limit of the wavelength of a laser beam used for removal of the antireflection film is preferably 380 nm or more, more preferably 400 nm or more. The upper limit of the above wavelength is preferably 500 nm or less, more preferably 480 nm or less.

The output power of the laser beam used in the present embodiment is preferably 5 W or more and 80 W or less.

When the output power of the laser beam is less than 5 W, decomposition and removal of the antireflection film is difficult. This is because a decrease in temperature due to spontaneous cooling is significant even when the substrate is heated by the photon energy absorbed by the silicon substrate. On the other hand, when the output power of the laser beam is in a range of more than 80 W, a silicon substrate may be melted. This is because the silicon substrate may be heated extensively to the periphery of a region irradiated with the laser beam. When the silicon substrate is melted, the texture architecture on the surface of the substrate in the vicinity underneath the metal electrode may be destroyed, resulting in increased reflectance and a damaged p-n junction structure. These in turn may deteriorate solar cell properties. Therefore, the lower limit of the output power of the laser beam used for removal of the antireflection film is preferably 5 W or more, more preferably 10 W or more. The upper limit is preferably 80 W or less, more preferably 50 W or less.

In the method of manufacturing a solar cell according to the present embodiment, a pulsed laser beam having a pulse width of 1 picosecond (ps) or more and 50 microseconds (µs) or less, is preferably used.

When the pulse width of a pulsed laser beam is less than 5 ps, reproducible removal of the antireflection film is difficult. This is because the thermal energy accumulated in the silicon substrate is continuously increased as the laser radiation time increases, resulting in an unstable thermal state of the substrate even when the output power of the laser beam is maintained constant within the above ranges.

When the laser-beam output power is large with a pulse width of the pulsed laser beam of more than 50 µs, a silicon substrate may be heated excessively, resulting in a destroyed texture architecture and a disrupted (damaged) p-n junction. On the other hand, the laser-beam output power is small, removal of the antireflection film may be difficult due to insufficient heating of the silicon substrate. As described above, opposing effects may occur depending on conditions of the output power when the pulse width is more than 50 µs. This may limit the range of the optimal processing conditions, and may decrease a yield for mass production. Therefore, an antireflection film is preferably removed with a pulsed laser beam with a pulse width of 1 ps or more and 50 µs or less in the removal step of the antireflection film.

The laser beam used in the present embodiment is preferably a pulsed laser beam having an output power density of 0.03 mJ/cm$^2$ or more and 20 J/cm$^2$ or less.

When the output power density is less than 0.03 mJ/cm$^2$, decomposition and removal of the antireflection film is difficult. This is because the amount of heat introduced into the silicon substrate is small, and the temperature of the substrate is not sufficiently increased. On the other hand, an output power density of more than 20 J/cm$^2$ is not preferred because the temperature of the silicon substrate is excessively increased, and the extent of removing the antireflection film is difficult to control.

In view of obtaining a good conversion efficiency for various silicon substrates having different texture architectures, the lower limit of the output power density of a pulsed laser beam is preferably 0.03 mJ/cm$^2$ or more, more preferably 0.05 mJ/cm$^2$ or more. The upper limit of the output power density is preferably 20 J/cm$^2$ or less, more preferably 10 J/cm$^2$ or less, 0.5 J/cm$^2$ or less.

In the method of manufacture according to the present embodiment, the removal step of an antireflection film preferably includes irradiation with a pulsed laser beam and continuous-wave laser.

Simultaneous irradiation with a pulsed laser beam and a continuous-wave (CW) laser beam can maintain localized and stable heating of a silicon substrate at an elevated temperature. Consequently, rapid cooling which may modify a portion of a substrate irradiated and heated with a pulsed laser beam into an amorphous structure can be avoided. Therefore, a substrate having a good crystalline structure can be obtained.

In the method of manufacture according to the present embodiment, the removal step of an antireflection film preferably includes heating a semiconductor substrate at 100° C. or more and 570° C. or less.

When the temperature of a silicon substrate is less than 100° C., a crack may occur in the substrate. This is because thermal stress may be developed due to an increased temperature difference between a portion irradiated with the laser beam and a portion not irradiated with the laser beam. Further, the eutectic reaction between an aluminum (Al) electrode formed on the back side of a cell and a silicon substrate occurs at a temperature of 577° C. Therefore, when the temperature is 570° C. or more, an Al electrode may be melted, or Al may be diffused excessively into a silicon substrate, resulting in deterioration of solar cell properties.

EXAMPLES

Below, the present invention will be described in more detail with reference to Examples. The present invention shall not be limited to these Examples. First, an Example in which silicon nitride (SiN) film was formed as an antireflection film by the plasma-enhanced chemical vapor deposition (PECVD) method is described.

Example 1

A silicon solar battery cell was produced as follows. A pyramidal texture with a height of 3 to 5 μm was formed at the side of the light-receiving surface of a silicon substrate by the anisotropic chemical etching method using a KOH solution. A SiN layer (antireflection film) with a thicknesses of 80 nm was formed on the texture by the PECVD method. Further, an Al paste and an Ag paste were screen-printed on the surface opposite to the light-receiving surface, and fired at 800° C. for 5 seconds under the air atmosphere to form a back-side electrode.

Next, the cell produced as described above was placed on a hot plate heated at 280° C., and the SiN layer at the side of the light-receiving surface was scanned with a laser beam according to a predetermined pattern. The scanned pattern was the same as the pattern of a finger electrode to be formed in the subsequent step. The diameter of the laser beam was 40 μm, and the scanning rate of the laser beam was 100 μm/min. The wavelength of the laser beam was 450 nm, and the laser beam emitted included a CW laser beam with an output power of 8 W and a pulsed laser beam with an output power of 30 W in an overlapping manner. The pulse width of the pulsed laser beam was 10 μs, and the frequency was 1 kHz.

The SiN layer was removed with the laser beam under the above conditions. Subsequently, each of the structures of a portion irradiated with the laser beam and a portion not irradiated on the surface of the substrate was observed using a scanning electron microscope (SEM). Further, composition analysis was performed for each of the above portions with an X-ray energy dispersive spectrometer (EDS) to investigate the distribution of the SiN layer.

Results from observation under SEM are shown in FIGS. 1A and 1B. FIG. 1A shows a surface of the substrate which was not irradiated with the laser beam, indicating that a surface of the silicon substrate had a texture architecture. EDS analysis was performed for a position indicated by "X" in a region 1 which was not irradiated with the laser beam. The EDS analysis was able to show that the SiN layer was formed in the region 1.

FIG. 1B shows a surface of the substrate which was irradiated with the laser beam, indicating that portions of the texture architecture were destroyed. EDS analysis was performed for a position indicated by "○" (open circle) in a region 2 which was irradiated with the laser beam. The EDS analysis shows that the SiN layer was removed, and the silicon substrate was exposed in the region 2. Similar analyses were performed at a total of 5 positions of the portion which was irradiated with the laser beam, and the area percentage of regions where the SiN layer was removed was determined to calculate the mean area percentage. The measurement results showed that the area percentages of the above portions were 21%, 23%, 35%, 39%, and 41%, and thus the mean area percentage was about 32%.

The method of measuring an area percentage is as follows. Regions where the SiN layer was removed were visually identified in an SEM image, and then that image was printed. The regions where the SiN layer was removed in the printed image were painted in black, and the image was then scanned to obtain electronic data in which light and dark were binarized. Then, the area percentage of the black portions was obtained from the binarized data using an image-processing software Image J.

Next, in order to observe a cross section of a portion where the SiN layer was removed (hereafter may also be referred to as a "SiN-removed portion"), a sample was processed with a focused ion beam microscope (FIB) to produce a cross section. Specifically, the surface of the sample was irradiated with 5-kV Ga ions to create a hole, i.e., to form a vertical wall (cross section). The surface portion of the cross section was then observed under SEM attached to FIB to investigate the ruggedness of the surface portion. A typical SEM image is shown in FIG. 2.

The cross section shown in FIG. 2 was measured for the center line average roughness (Ra) of the silicon surface in the portion where SiN was removed. Similar observations were performed at a total of 5 positions to measure Ra. The mean was calculated and found to be about 0.6 μm.

The method of measuring Ra is as follows. The center line was obtained by drawing an approximately parallel straight line at the surface portion in an SEM image, and finely adjusting the position of the straight line so that the area of protruded portions above the straight line is equal to the area of the depressed portions with an error of about 10% or less. Next, the area (A1) of the protruded portions and the area (A2) of the depressed portions defined by the center line, and the overall length (L1) of the center line at the protruded portions and the overall length (L2) of the center line at the depressed portions were obtained. Ra is calculated by (A1/L1+A2/L2)/2.

Further, a thin sample of the cross section was prepared with FIB. The surface of the SiN layer was coated with gold (Au) prior to FIB processing to reduce the charge-up effect during observation. Further, the FIB processed portion was coated with a carbon film to prevent removal of the surface of the sample during FIB processing. The observation result of the sample with a transmission electron microscope (TEM) is shown in FIG. 3. Neither an aggregate of point defects nor a lattice defect such as dislocations was observed around the surface portion of silicon. As indicated by white arrows in FIG. 3, black contrast-lines (bend contours) 3 were observed. This indicated that the substrate had a structure where a monocrystalline structure as an underlying layer of the SiN layer is continued to the surface.

Figure 4:
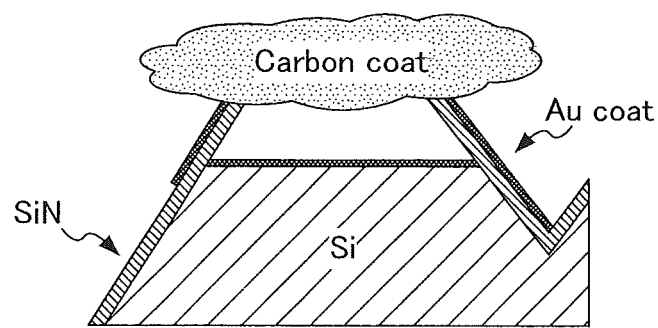
FIG. 4 schematically shows a cross section of a region where the antireflection film was removed.

FIG. 4 schematically shows the structure of the cross section observed in FIG. 3. An SiN film as an antireflection film is disposed on the texture architecture formed on the surface of a silicon substrate. An Au coating and a carbon coating are formed thereon.

Figure 5:
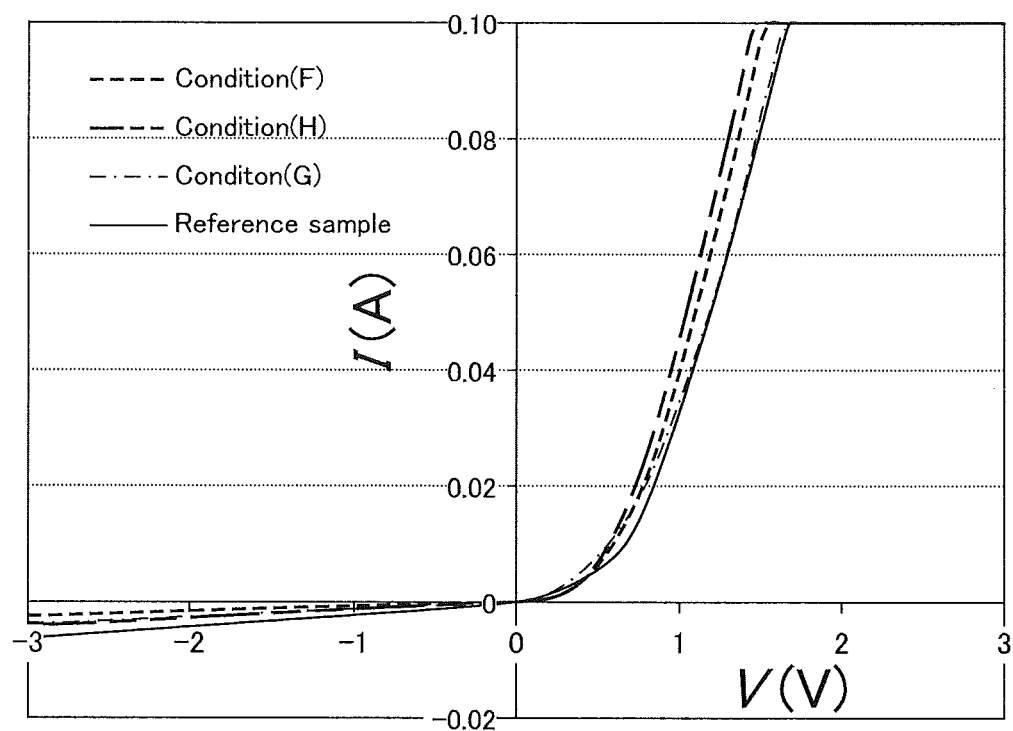
FIG. 5 shows a graph illustrating the relationship between dark current (I) and voltage (V) of a sample from which the antireflection film was removed with laser.

A barrier layer was formed on the surface of each of the samples having an architecture showed in FIG. 1A, FIG. 1B, FIG. 2, or FIG. 3 by the sputtering method, and a copper paste was applied by the screen printing method, and then firing was performed to produce wiring. The barrier layer, copper paste, and method of firing were used under conditions and a method similar to those described in JP5598739 and JP5735093 of the present applicant. Specifically, an 8-nm Mn layer was formed as a barrier layer, and a copper paste was printed. Then, oxidation firing was performed at 350° C. for 5 minutes, and reduction firing was further performed at 450° C. for 5 minutes. The atmosphere during oxidation was Ar+1% $O_2$, and the atmosphere during reduction was Ar+5% $H_2$. In order to evaluate diode characteristics of each of the samples, mercury probes were brought into contact with the light-receiving surface and the back surface to determine the relationship between dark current and voltage. The results are shown in FIG. 5. The samples prepared as described above correspond to "Conditions F, G, and H" in FIG. 5. Each sample was produced with a pulsed laser beam with varied conditions of output power. Laser beams with 20 W, 25 W, and 30 W were emitted to F, G, and H, respectively.

In FIG. 5, the curve of "Reference Sample" represents measurement results of a sample in which the SiN layer was removed by the photolithograph method, a barrier layer and a copper paste electrode were formed, and the conversion efficiency was found to be 19%. The results show that the samples prepared as described above (Conditions F, G, and H) have electrical properties comparable with those of the reference sample, indicating that the p-n junctions of the silicon substrates were not damaged by laser irradiation. A barrier layer and copper wiring were then formed on each of these samples, and the conversion efficiency was measured. Results showed that it was in the range of 15 to 18.5%.

Results from SEM observation of the samples where the SiN layer was removed with varied output power densities ($J/cm^2$) of the pulsed laser beam are shown in FIG. 6A, FIG. 6B, and FIG. 6C. The output power density of the pulsed laser beam emitted was 0.55 $J/cm^2$ for FIG. 6A, 0.61 $J/cm^2$ for FIG. 6B, and 0.76 $J/cm^2$ for FIG. 6C.

For any of the output power densities, white contrast portions and gray contrast portions were observed on the texture surface. The analysis results by EDS showed that the SiN layer was removed, and the Si surface was exposed in the former white contrast portions. In the latter gray contrast portions, $SiO_2$ was formed. Further, the valley portions of the pyramidal texture architecture were deeply formed, which tended to be more significant as the output power density increased.

Further, a barrier layer and copper wiring were formed in each of these samples to determine the relationship between dark current and voltage relations. In the forward bias (in a region of positive voltage in FIG. 5), the electric current value was small, and the conversion efficiency was measured to be in the range of 10 to 14%.

Example 2

A pyramidal texture with a height of 3 to 5 µm was formed at the side of the light-receiving surface of a silicon substrate by the anisotropic chemical etching method using a KOH solution as in the samples of the silicon solar battery cells used in Example 1. An SiN layer with a thicknesses of 80 nm was formed on the texture by the PECVD method. Further, an Al paste and an Ag paste were screen-printed on the surface opposite to the light-receiving surface, and fired at 800° C. for 5 seconds under the air atmosphere to form a back-side electrode.

Next, the cell produced as described above was placed on a hot plate heated at 280° C., and the SiN layer at the side of the light-receiving surface was scanned with a laser beam according to a predetermined pattern. The scanned pattern was the same as the pattern of a finger electrode to be formed in the subsequent step. The diameter of the laser beam was 40 µm, and the wavelength of the laser beam was 450 nm. The area percentage of SiN-removed portions in a region 2 irradiated with the laser beam as indicated by "o" (open circle) in FIG. 1B was able to be changed by changing the pulse width, output power density, and scan rate of the pulsed laser beam. A barrier layer and copper wiring were formed on the sample as described above, and the fill factor (FF), open circuit voltage ($V_{oc}$), and surface resistance (Rs), which are solar cell properties, were measured. Typical results are shown in Table 1.

As shown in Table 1, FF was 75% or more when the mean area percentage of the SiN-removed portions was 10% or more. Further, $V_{oc}$ was decreased to less than 630 mV when the mean area percentage was more than 80%. A mean area percentage of 80% or less was required to maintain a high $V_{oc}$. As described above, the area percentage of the SiN-removed portions was found to be preferably 10% or more and 80% or less in view of FF and $V_{oc}$.

TABLE 1

| The mean area percentage of SiN-removed portions | 4 | 10 | 27 | 63 | 80 | 91 | 95 |
|---|---|---|---|---|---|---|---|
| Rs (mΩ) | 5.1 | 3.2 | 3.0 | 2.8 | 2.6 | 2.4 | 2.3 |
| FF (%) | 70 | 75 | 76 | 78 | 79 | 80 | 80 |
| $V_{oc}$ (mV) | 648 | 642 | 639 | 632 | 630 | 627 | 620 |

Further, An SiN-removed portions was processed to create a cross-section by FIB, and the architecture was observed as shown in FIG. 2. The center line average roughness (Ra) of the surface was then determined. A barrier layer and copper wiring were formed on a sample produced under the same conditions, and the interfacial contact resistivity was evaluated by the transfer length method (commonly referred to as the TLM method), and the adhesion strength between the wiring and the substrate was evaluated by the tape test. In the tape test, an adhesive tape (Product name 3M Scotch tape) was applied over the wiring, and allowed to closely adhere with the wiring by strongly rubbing it with a finger. Then, whether the copper wiring was detached or not from the substrate was evaluated when removing the tape. It was evaluated as "good" when not detached, and "not suitable" when detached. These measurement results are shown in Table 2.

As shown in Table 2, the interfacial contact resistance was 0.3 mΩcm² or less when Ra was 1.5 µm or less, indicating that the adhesiveness of the wiring in the tape test was excellent. The results demonstrated that good solar cell properties were able to be obtained when Ra was 1.5 µm or less.

TABLE 2

| Ra (µm) | 0.3 | 0.6 | 0.9 | 1.0 | 1.8 | 3.2 |
|---|---|---|---|---|---|---|
| Interfacial contact resistivity (mΩcm²) | 0.04 | 0.1 | 0.16 | 0.3 | 0.9 | 2.4 |
| Results from tape tests | Good | Good | Good | Good | Not suitable | Not suitable |

Example 3

A pyramidal texture with a height of 3 to 5 µm was formed on the light-receiving surface of a silicon substrate by the anisotropic chemical etching method using a KOH solution as in the samples of the silicon solar battery cells used in Example 1. An SiN layer with a thicknesses of 80 nm was formed on the texture by the PECVD method. Further, an Al paste and an Ag paste were screen-printed on the surface opposite to the light-receiving surface, and fired at 800° C. for 5 seconds under the air atmosphere to form a back-side electrode.

Next, the cell produced as described above was placed on a hot plate heated at 280° C., and the SiN layer at the side of the light-receiving surface was scanned with a laser beam according to a predetermined pattern. The scanned pattern was the same as the pattern of a finger electrode to be formed in the subsequent step. The diameter of the laser beam was 40 μm, and the scanning rate of the laser beam was 100 μm/min. The SiN layer was removed with varied wavelengths using various laser beam sources having the same output power of 30 W. Further, a barrier layer was formed on the SiN-layer removed portions, and copper wiring was formed. Solar cell properties were then measured. Results obtained are shown in Table 3.

As shown in Table 3, $V_{oc}$ was decreased to less than 630 mV when the wavelength was less than 380 nm. This is likely because of damage to the silicon substrate and carrier recombination. On the other hand, when the wavelength was more than 500 nm, Rs was more than 3 mΩ, indicating that a high resistance layer remained. Although examples where a pulsed laser beam was used were described herein, similar results were also obtained when a CW laser beam was used. These results showed that good solar cell properties were able to be obtained when the wavelength of a laser beam was 380 nm or more and 500 nm or less.

TABLE 3

| Wavelength (nm) | 308 | 350 | 400 | 450 | 488 | 514 | 633 |
|---|---|---|---|---|---|---|---|
| $V_{oc}$ (mV) | 610 | 622 | 635 | 638 | 640 | 640 | 641 |
| Rs (mΩ) | 1.2 | 1.8 | 2.0 | 2.2 | 2.5 | 6.3 | 8.1 |

Example 4

A pyramidal texture with a height of 3 to 5 μm was formed on the light-receiving surface of a silicon substrate by the anisotropic chemical etching method using a KOH solution as in the samples of the silicon solar battery cells used in Example 1. An SiN layer with a thicknesses of 80 nm was formed on the texture by the PECVD method. Further, an Al paste and an Ag paste were screen-printed on the surface opposite to the light-receiving surface, and fired at 800° C. for 5 seconds under the air atmosphere to form a back-side electrode.

Next, the SiN layer at the side of the light-receiving surface of the above cell was scanned with a pulsed laser beam according to a predetermined pattern. The scanned pattern was the same as the pattern of a finger electrode to be formed in the subsequent step. The diameter of the laser beam was 40 and the scanning rate of the laser beam was 100 μm/min. A pulsed laser beam and a CW laser beam were both emitted simultaneously with output powers varied in the range of 1 W to 100 W, both of the laser beams having the same wavelength of 450 nm. Further, the pulse width was varied in the range of 0.1 μs to 100 μs. Moreover, the output power density of the pulsed laser beam was varied in the range of 0.01 mJ/cm² to 3 J/cm². Furthermore, the temperature of the substrate was varied from room temperature to 600° C.

Under the above processing conditions, the conversion efficiency was 15 to 18.5% when the output power of the laser beams was 5 W or more and 80 W or less, and the pulse width was 1 μs or more and less than 50 μs, and the output power density was 0.03 mJ/cm² or more and 20 J/cm². In this way, we could obtain a cell with similar performance to the conventional cell using silver paste metallization formed by the fire through method.

Moreover, the antireflection film could be removed without breaking the substrate and without melting the Al electrode on the back side during laser processing when the substrate was heated at 100° C. or more and less than 570° C. The conversion efficiency of that cell was found to be about 18%.

In the above, described are examples where an SiN film was formed to be used as an antireflection film by the PECVD method. Similar results can be obtained by using insulating materials having similar properties to those of SiN. The results obtained in the present Examples are not limited to SiN, but similar results can also be obtained with other antireflection films such as oxides and carbides.

EXPLANATION OF REFERENCE NUMERALS

1 Region not irradiated with laser beam
2 Region irradiated with laser beam
3 Bend contour

What is claimed is:

1. A solar cell comprising a metal electrode, an antireflection film, and a semiconductor substrate, wherein a plurality of portions in which the antireflection film is absent is defined along a first direction and a second direction perpendicular to the first direction in a plan view of the antireflection film, the portion where the antireflection film is absent being disposed between a bottom of the metal electrode formed at a side of a light-receiving surface and the semiconductor substrate, and a mean area percentage of the portion where the antireflection film is absent is 10% or more and 80% or less relative to an area of the bottom of the metal electrode, wherein the portion where the antireflection film is absent is composed of a plurality of sub-portions, each of the sub-portions being surrounded by a portion where the antireflection film is present in the plan view,
   wherein the semiconductor substrate has a pyramidal texture on the side of the light-receiving surface of the semiconductor substrate and the pyramidal texture is destroyed at the portion where the antireflection film is absent, and
   wherein a surface of the semiconductor substrate has a center line average roughness (Ra) of 1.5 μm or less at the portion where the antireflection film is absent.

2. The solar cell according to claim 1, wherein the semiconductor substrate located underneath the metal electrode has a crystalline structure.

3. A method of manufacturing the solar cell of claim 1, the method comprising:
   forming the antireflection film on the semiconductor substrate; partially removing the antireflection film by irradiating with a laser beam on a region of the antireflection film corresponding to a location where the metal electrode is to be formed; and forming the metal electrode,
   wherein the partially removing the antireflection film includes irradiation with the laser beam having a wavelength of 380 nm or more and 500 nm or less.

4. The method of manufacturing the solar cell according to claim 3, wherein the laser beam has an output power of 5 W or more and 80 W or less.

5. The method of manufacturing the solar cell according to claim 3, wherein the laser beam comprises a pulsed laser beam with a pulse width of 1 picosecond or more and 50 microseconds or less.

6. The method of manufacturing the solar cell according to claim 3, wherein the laser beam comprises a pulsed laser beam with an output power density of 0.03 $mJ/cm^2$ or more and 20 $J/cm^2$ or less.

7. The method of manufacturing the solar cell according to claim 3, wherein the laser beam comprises a pulsed laser beam and a continuous-wave laser beam.

8. The method of manufacturing the solar cell according to claim 3, wherein the partially removing the antireflection film includes heating the semiconductor substrate at 100° C. or more and 570° C. or less.

* * * * *